US007227193B2

(12) United States Patent
Oda

(10) Patent No.: US 7,227,193 B2
(45) Date of Patent: Jun. 5, 2007

(54) SOLID-STATE IMAGE SENSOR WITH MICRO-LENSES FOR PREVENTING SHADING

(75) Inventor: Kazuya Oda, Asaka (JP)

(73) Assignee: Fujifilm Corporation, Tokyo (JP)

( * ) Notice: Subject to any disclaimer, the term of this patent is extended or adjusted under 35 U.S.C. 154(b) by 232 days.

(21) Appl. No.: 11/080,491

(22) Filed: Mar. 16, 2005

(65) Prior Publication Data

US 2005/0205956 A1 Sep. 22, 2005

(30) Foreign Application Priority Data

Mar. 17, 2004 (JP) ............................ 2004-075578

(51) Int. Cl.
*H01L 27/14* (2006.01)
*H01L 31/00* (2006.01)
*H01L 29/22* (2006.01)
*H01L 29/227* (2006.01)
*H01L 33/00* (2006.01)

(52) U.S. Cl. ........................ 257/98; 257/431; 257/432; 257/444; 257/E33.067; 257/E33.068; 257/E33.073

(58) Field of Classification Search .................. 257/98, 257/431, 432, 444, E33.067, E33.073
See application file for complete search history.

(56) References Cited

U.S. PATENT DOCUMENTS 5,536,455 A * 7/1996 Aoyama et al. ............. 264/1.7
6,518,640 B2 * 2/2003 Suzuki et al. ............... 257/432
6,586,811 B2 * 7/2003 Sekine ........................ 257/432
6,753,557 B2 * 6/2004 Nakai ......................... 257/233
6,777,661 B2 * 8/2004 Summa et al. ........... 250/208.1
6,861,280 B2 * 3/2005 Yamamoto ................... 438/70
7,091,516 B2 * 8/2006 Burroughes .................. 257/40
2005/0142689 A1 * 6/2005 Kim ............................ 438/69
2006/0151818 A1 * 7/2006 Toumiya ..................... 257/294

FOREIGN PATENT DOCUMENTS

JP 4-298175 10/1992
JP 10-74926 3/1998

* cited by examiner

*Primary Examiner*—Jerome Jackson
*Assistant Examiner*—Jesse A. Fenty
(74) *Attorney, Agent, or Firm*—McGinn IP Law Group, PLLC

(57) ABSTRACT

A solid-state image sensor prevents shading while maintaining the wide dynamic range of an image signal without reducing its resolution. The image sensor has its photodiode array including arrangement patterns, each of which includes a smaller micro-lens and larger micro-lenses arranged on the top, bottom, right and left sides of the smaller micro-lens in a first virtual plane formed by the array. When the arrangement pattern is viewed in parallel to the virtual plane through a gap between the larger micro-lenses positioned on the bottom and left sides of the smaller micro-lens in the plane, the image of an unhidden part of the smaller micro-lens visible through the gap is, at most, half as much in area as the whole image of the smaller micro-lens projected on a second virtual plane perpendicular to the first virtual plane.

8 Claims, 5 Drawing Sheets

SOLID-STATE IMAGE SENSOR WITH MICRO-LENSES FOR PREVENTING SHADING

BACKGROUND OF THE INVENTION

1. Field of the Invention

The present invention relates to a solid-state image sensor that comprises a micro-lens for each photodiode.

2. Description of the Background Art

Some conventional solid-state image sensors provide the wide dynamic range of an image signal representative of a scene captured while maintaining the photo-sensitivity of photodiodes or photosensitive cells. For example, in the solid-state image sensor disclosed in Japanese Patent Laid-Open Publication No. 298175/1992, hereinafter referred to as Document 1, two types of horizontal lines of photodiodes are arranged alternately in the vertical direction. Specifically, one type of horizontal line contains higher-sensitivity photodiodes and the other contains lower-sensitivity photodiodes. Then, every two photodiodes, vertically adjacent to each other, of different sensitivities work together as one pixel. Because signal charges obtained respectively from the two photodiodes as one pixel are added up to a signal charge of the pixel, the sensor can accomplish a scene with a wide dynamic range.

Another Japanese Patent Laid-Open Publication No. 74926/1998, hereinafter referred to as Document 2, describes a solid-state image sensor comprising an array of photodiodes or photosensitive cells and micro-lenses, so-called on-chip lenses, correspondingly placed on the photodiodes toward a field of view to be captured for concentrating incident photons or beams from the field onto the respective photodiodes. The solid-state image sensor disclosed in Document 2 does not have only one type of photodiodes that receive incident beams impinging on the micro-lenses but also another type of photodiodes that receive incident beams impinging on, and transmitted through, the spaces between the lenses to increase the aperture efficiency of the respective pixels.

When one pixel is composed of two photodiodes of different sensitivities as described in Document 1, there is a layout restriction such that those two photodiodes forming one pixel must be adjacent to each other. Because of this restriction, the solid-state image sensor described in Document 1 has to have the higher-sensitivity photodiodes arranged in odd-numbered lines only and the lower-sensitivity photodiodes arranged in even-numbered lines only. Each pixel is thus formed by a couple of photodiodes existing on two horizontal lines, adjacent to each other, in the same horizontal position of the array of photodiodes. This means that the resolution in the vertical direction is degraded to one half of that achieved in the case that each pixel exists on one line in the same horizontal position.

When one pixel is composed of two photodiodes, it is better to provide micro-lenses on both of the higher- and lower-sensitivity photodiodes than utilizing the spaces between the micro-lenses placed on the higher-sensitivity photodiodes to conduct incident beams to the lower-sensitivity photodiodes as described in Document 2. More specifically, the provision of micro-lenses of a smaller diameter on the lower-sensitivity photodiodes in addition to micro-lenses of a larger diameter disposed on the higher-sensitivity photodiodes results in a higher efficiency in concentrating the beams. However, because part of the incident beams impinging on the smaller-diameter micro-lenses may be blocked by the larger-diameter micro-lenses, a shading problem could occur.

SUMMARY OF THE INVENTION

It is an object of the present invention to provide a solid-state image sensor in which two types of photodiodes form one pixel with the shading minimized without decreasing the resolution of an image captured while maintaining the wide dynamic range of an image signal.

A solid-state image sensor in accordance with the present invention comprises a plurality of arrangement patterns of micro-lenses on an array of photodiodes forming a first virtual plane, each pattern being composed of a smaller micro-lens and larger micro-lenses, the larger micro-lenses having the diameter thereof larger than the diameter of the smaller micro-lens and being arranged on the top, bottom, right and left sides of the smaller micro-lens. When the arrangement pattern is viewed in parallel to the virtual plane through a gap between one of the large micro-lenses arranged on the top and bottom sides of the smaller micro-lens and one of the larger micro-lenses arranged on the right and left sides of the smaller micro-lens, the image of an unhidden part of the smaller micro-lens visible through the gap is, at most, half as much as the whole image of the smaller micro-lens projected on a second virtual plane perpendicular to the first virtual plane.

In accordance with the present invention, a solid-state image sensor, in which one pixel is composed of two photodiodes of different sensitivities, maintains its wide dynamic range and resolution at the same time and improves the S/N ratio (signal-to-noise ratio) so that the image quality is not degraded. In addition, the solid-state image sensor minimizes shading that would have been caused by the conventional micro-lenses.

BRIEF DESCRIPTION OF THE DRAWINGS

The objects and features of the present invention will become more apparent from consideration of the following detailed description taken in conjunction with the accompanying drawings in which.

DESCRIPTION OF THE PREFERRED EMBODIMENTS

Figure 1:
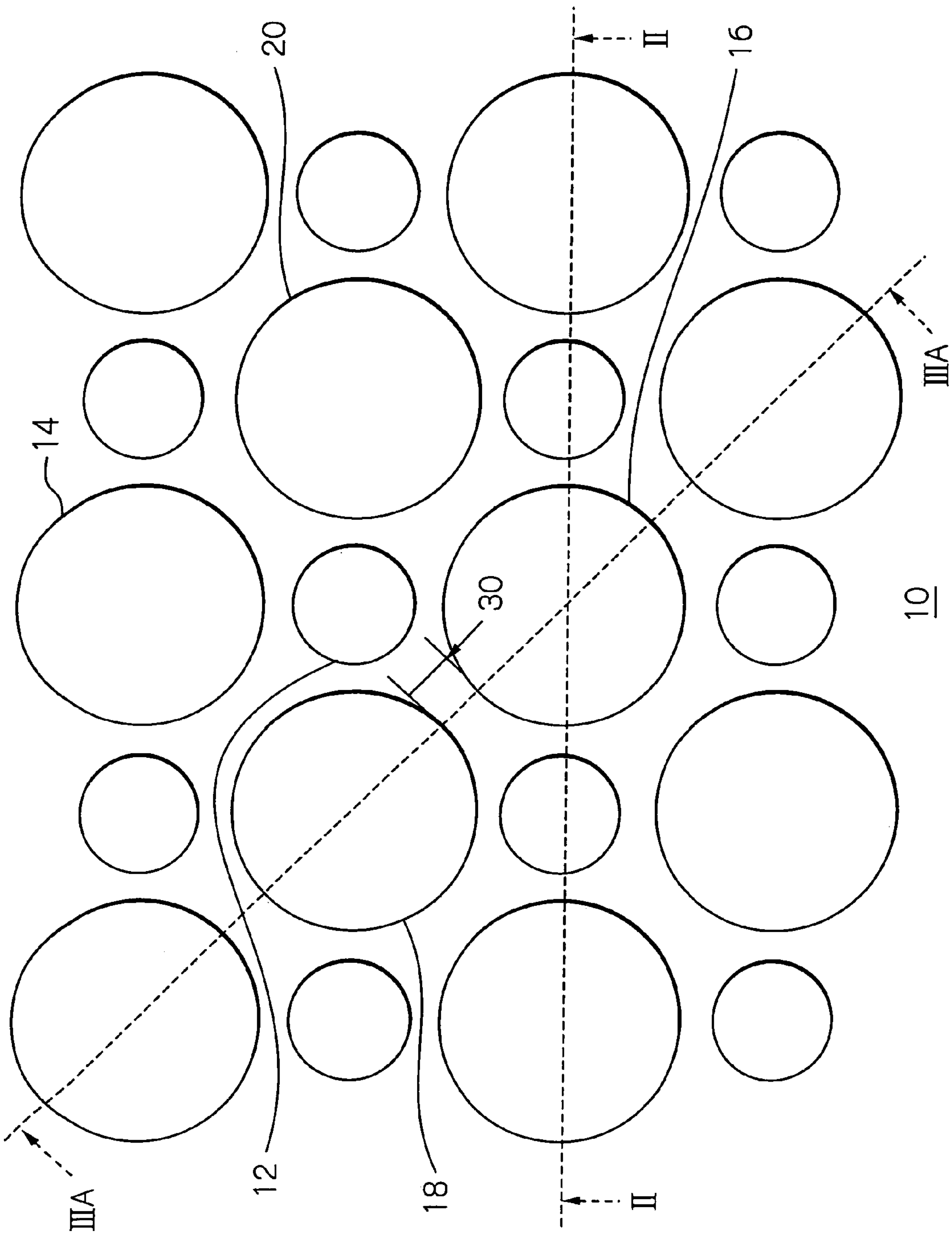
FIG. 1 is a top plan view schematically showing part of an array of photodiodes of a conventional solid-state image sensor to be compared with a solid-state image sensor according to the present invention.

Next, with reference to the accompanying drawings, preferred embodiments of the solid-state image sensor according to the present invention will be described in detail. Prior to describing the invention, reference will be made to FIG. 1, which shows, in a top plan view, part of an array of photodiodes of a conventional solid-state image sensor to be compared with the solid-state image sensor according to the present invention. Although the micro-lenses of the solid-state image sensor shown in FIG. 1 are arranged in the same way as those of the solid-state image sensor according to the present invention so far as the geometrical position thereof is concerned, the size and shape of the micro-lenses of FIG. 1 are different from those of the micro-lenses of the solid-state image sensor according to the present invention. Described in the following will be the arrangement of micro-lenses of the solid-state image sensor shown in FIG. 1 and the cause of shading.

FIG. 1 depicts part of an array of photodiodes or photosensitive cells 10 of the solid-state image sensor, which array consists of a plurality of arrangement patterns, each of which is formed of a smaller micro-lens 12 with a smaller diameter and larger micro-lenses 14, 16, 18 and 20 with a larger diameter that are placed on the top, bottom, right and left sides, in the figure, of the smaller micro-lens 12. The larger micro-lenses 14, 16, 18 and 20 are thus larger in diameter than the smaller micro-lens 12. FIG. 1 shows a part of the array of photodiodes 10, and the pattern described above is repeated all over the actual array of photodiodes 10. The distance between the smaller micro-lens 12 and the large micro-lens 14 is substantially equal to that between the smaller micro-lens 12 and the larger micro-lens 16, and the distance between the smaller micro-lens 12 and the larger micro-lens 18 is substantially equal to that between the smaller micro-lens 12 and the larger micro-lens 20. That is, the larger and smaller micro-lenses are arranged alternately both vertically and horizontally. If drawing straight lines through the centers of the micro-lenses vertically and horizontally, rectangular or square lattice patterns are created. In the case of FIG. 1, square lattice patterns are created.

The smaller micro-lens 12 concentrates an incident beam onto a lower-sensitivity photodiode provided under the lens 12 in the depth of FIG. 1, while the larger micro-lenses 14, 16, 18 and 20 concentrate incident beams onto higher-sensitivity photodiodes provided under the lenses 14, 16, 18 and 20 in the depth of FIG. 1. In the figure, the photodiodes or photosensitive cells are not shown.

Figure 2:
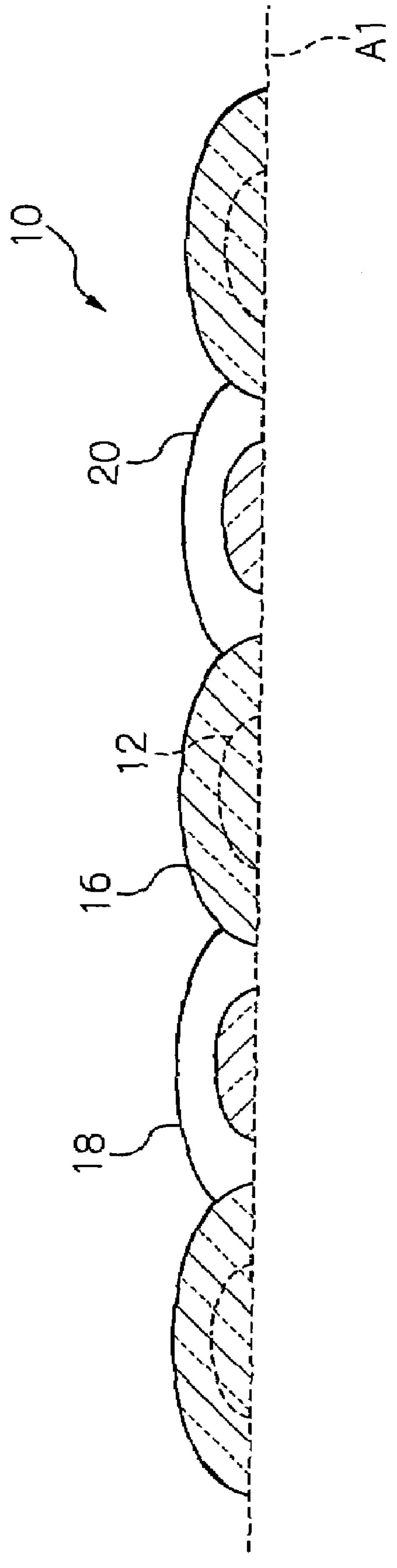
FIG. 2 is a schematic cross-sectional view of the array of photodiodes taken along a straight line II in FIG. 1.

FIG. 2 is a schematic cross-sectional view of the part of the array of photodiodes 10 taken vertically along a straight line II in FIG. 1 and viewed in the arrow direction of the line II. The straight line II passes through the centers of the larger micro-lens 16 and of the larger and smaller micro-lenses arranged on the right and left sides of the lens 16 in the figure. Because the larger micro-lens 16 is taller than the smaller micro-lens 12, the smaller micro-lens 12 is completely hidden by the larger micro-lens 16, as shown by the dotted line 12, when viewed from the vertical cross section of the array of photodiodes 10 as shown in FIG. 2.

Figures 3A, 3B, 3C:
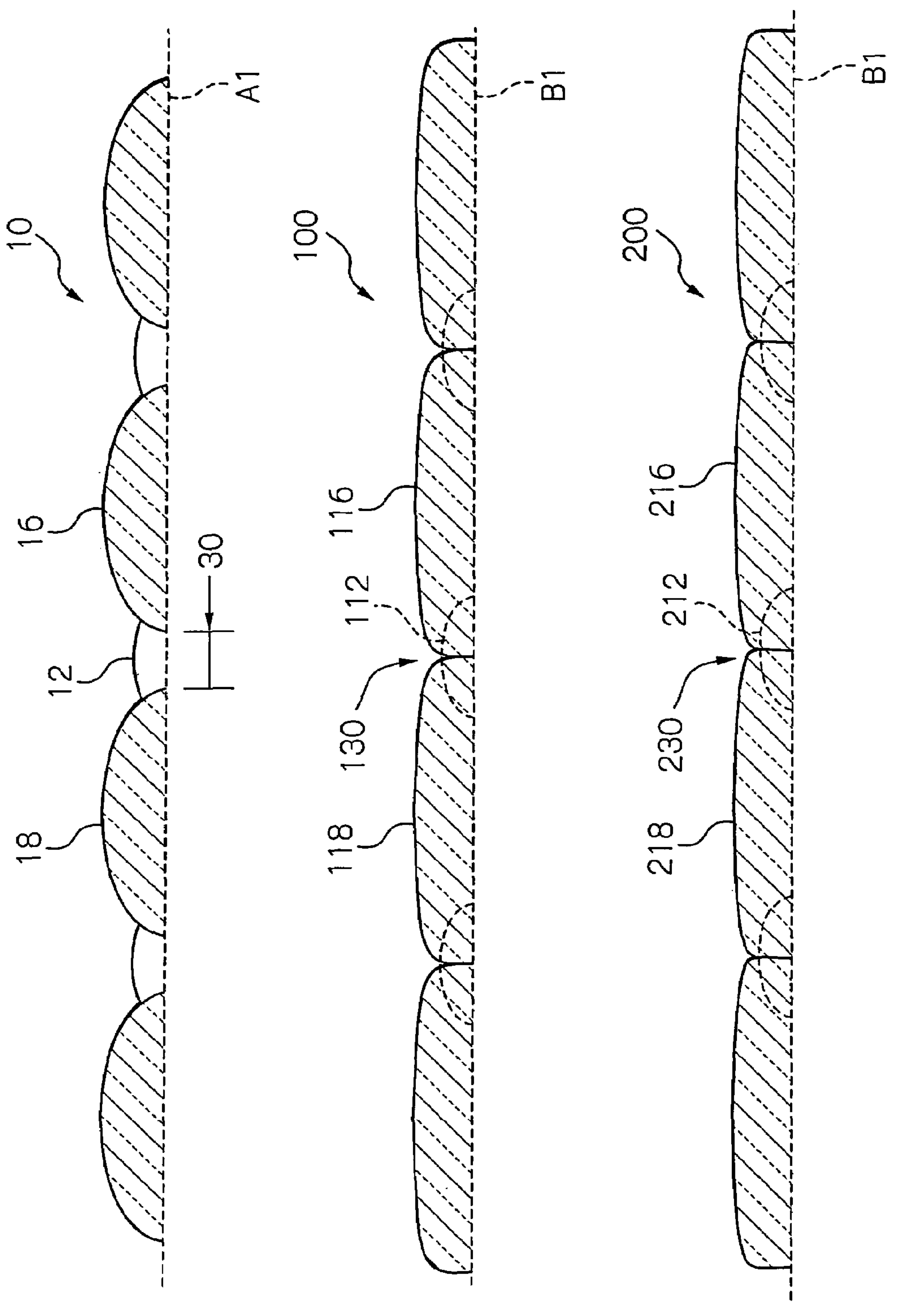
FIG. 3A is a schematic cross-sectional view of the array of photodiodes taken along a straight line IIIA in FIG. 1.
FIG. 3B is also a schematic cross-sectional view, like FIG. 3A, of the array of photodiodes taken along a straight line IIIB in FIG. 5.
FIG. 3C is also a schematic cross-sectional view, like FIG. 3A, of the array of photodiodes in which smaller micro-lenses cannot be seen.

FIG. 3A is also a schematic across-sectional view of the array of photodiodes 10 taken vertically along a straight line IIIA in FIG. 1 and viewed in the arrow direction of the line IIIA. The straight line IIIA passes obliquely in FIG. 1 through the centers of the larger micro-lenses 16 and 18. As shown in FIG. 3A, both right and left peripheries of the smaller micro-lens 12 are hidden by the larger micro-lenses 16 and 18 arranged on the left and bottom sides of the smaller micro-lens 12. However, because there is a gap or space 30 between the larger micro-lenses 16 and 18, the smaller micro-lens 12 can be seen through the gap 30.

As shown in FIG. 2, the smaller micro-lens 12 is hidden by the larger micro-lenses 14, 16, 18 and 20 and therefore cannot be seen when viewed in parallel to the array of photodiodes 10 and from the top, bottom, right and left sides of the lens 12. By contrast, as shown in FIG. 3A, the smaller micro-lenses 12 can be seen through the gaps between the larger micro-lenses 14, 16, 18 and 20 when viewed in parallel to the array of photodiodes 10 and in the oblique direction in FIG. 1. Therefore, incident beams impinging on the smaller micro-lens 12 in the top, bottom, right and left directions in FIG. 1 are partially blocked by the larger micro-lenses 14, 16, 18 and 20. More specifically, not blocked are incident beams of a smaller incident angle that impinge almost perpendicularly onto the array of photodiodes 10, i.e. a virtual plane A1 formed by the photodiode array 10, but blocked are incident beams of a larger incident angle coming in the top, bottom, right and left directions in FIG. 1. By contrast, incident beams impinging on the smaller micro-lenses 12 in the oblique direction in FIG. 1 are not blocked at all because they come to the smaller micro-lenses 12 through the gaps 30. An incident angle is defined by an angle which a beam incident on a photodiode array has with respect to a normal to a plane formed by the array.

As described above, the incident beams coming in the oblique direction in FIG. 1 and received by the smaller micro-lens 12 are larger in amount than those coming in the top, bottom, right or left direction. In other words, the maximum incident angle of incident beams, with respect to a normal to the virtual plane A1 formed by the array 10, which are able to reach the smaller micro-lens 12 in the oblique direction in FIG. 1 is larger than the maximum incident angle of incident beams that can reach the lens 12 in the top, bottom, right or left direction.

Figure 4:
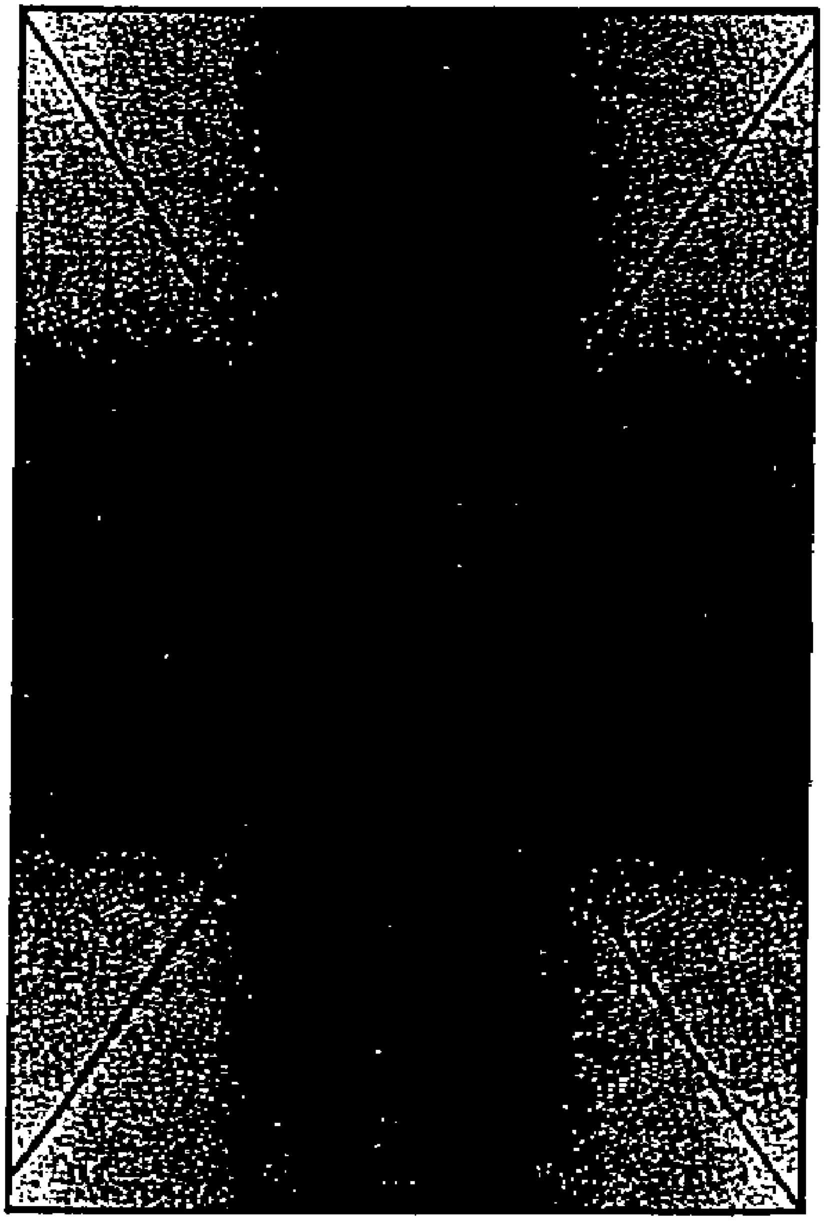
FIG. 4 exemplarily shows a shading pattern caused by lower-sensitivity photodiode under the smaller micro-lenses in FIG. 1.

FIG. 4 exemplarily shows a shading pattern caused by lower-sensitivity photodiodes disposed under the smaller micro-lenses. As shown in the figure, the shading pattern has its shape like a cross running in the top, bottom, right and left directions. As described above, this is because the amount of an incident beam that can impinge on the smaller micro-lens 12 in the oblique direction in FIG. 4 is larger than that of an incident beam coming in the top, bottom, right or left direction.

Figure 5:
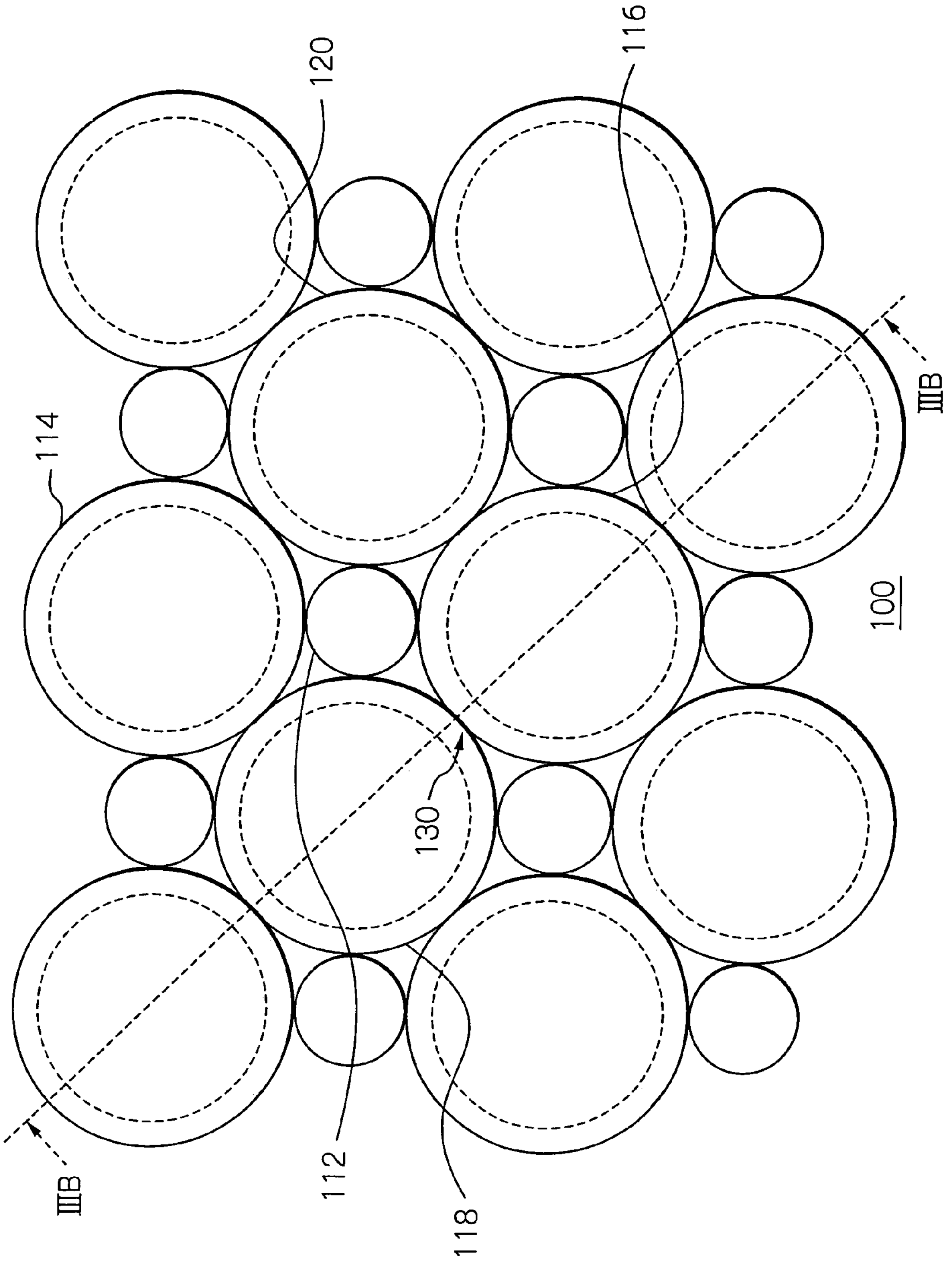
FIG. 5 is a top plan view, like FIG. 1, schematically showing part of the array of photodiodes of an embodiment of a solid-state image sensor according to the present invention.

Now, FIG. 5 is a top plan view showing an embodiment of a solid-state image sensor according to the present invention. The features of the solid-state image sensor according to the present invention will be described by comparing it with the conventional solid-state image sensor shown in FIG. 1. The larger micro-lenses shown in FIG. 1 are also indicated by dotted circles in FIG. 5 for the purpose of comparison. As described earlier, the larger and smaller micro-lenses of FIG. 5 are arranged in the same fashion as those of FIG. 1 so far as the geometrical position thereof is concerned. The size and shape of a larger micro-lens of FIG. 5 are different from those of FIG. 1. As shown in FIG. 5, the diameter of the larger micro-lenses 114, 116, 118 and 120 on the top, bottom, right and left sides of the smaller micro-lens 112 is larger than that of the corresponding larger micro-lenses 14, 16, 18 and 20 shown in FIG. 1. It is desirable that the diameter of a larger micro-lens of this embodiment would be large to an extent that there is substantially no gap or space left between the adjacent larger micro-lenses as shown in FIG. 5. However, a small gap may be left.

FIG. 3B is a schematic cross-sectional view of the array of photodiodes 100 taken vertically along a straight line IIIB in FIG. 5 and viewed in the arrow direction of the line IIIB. Comparison of FIG. 3B with FIG. 3A reveals how are the features of the embodiment of the solid-state image sensor according to the present invention. The larger micro-lenses 114, 116, 118 and 120 shown in FIG. 3B have not only its diameter larger than, but also its shape different from, the corresponding, larger micro-lenses 14, 16, 18 and 20 shown in FIG. 3A. More specifically, in FIG. 3B, to the extent that the function of the larger micro-lenses per se to concentrate incident beams onto the photodiodes under the lenses associated therewith can be maintained, the curvature of the lenses is decreased in order to almost close up the gaps which would have otherwise existed between the larger lenses. As a result, the illustrative embodiment includes the gaps 130 of FIG. 3B almost closed up, rather than the conventional gaps 30 of FIG. 3A.

Specifically, FIG. 3B shows the smaller micro-lenses 112 viewed in parallel to an array of photodiodes or photosensitive cells 100 through the gaps 130 almost closed up between the adjacent, larger micro-lenses 116 and 118 arranged respectively on the bottom and left sides, in FIG. 5, of the lens 112 in each of the specific arrangement patterns. In this case, so far as the image of the smaller micro-lenses 112 is concerned which is projected on a virtual plane, not shown, normal to the array of photodiodes 100, the not-hidden part of the smaller micro-lenses 112 which is visible through the gaps 130 is, at most, half as much in area as the entire smaller micro-lenses 112, i.e. the area indicated by the dotted line 112 in FIG. 3B. In other words, in FIG. 3A, more than half of the whole area of the smaller micro-lenses 12 can be seen through the gaps 30, whereas the gaps 130 of FIG. 3B are almost closed up between the adjacent, larger micro-lenses so that the smaller micro-lens 112 can be seen little.

Typically, the shape of the larger micro-lenses 114, 116, 118 and 120 is designed in such a fashion that the curvature of the surface thereof is so adjusted as to determine the area of the image of the smaller micro-lenses 112 that can be viewed through the gaps 30 between the larger micro-lenses 116 and 118 and is projected on the normal plane stated above. It should be noted that the shape of the larger micro-lenses can be determined freely as long as the function for concentrating incident beams is maintained and is not limited specifically to that shown in FIG. 3B.

As described above, the smaller micro-lenses 112 can be seen little through the gaps 130 in FIG. 3B. It is also possible to further modify the shape of the larger micro-lenses 114, 116, 118 and 120 so as to substantially nullify the area of the projected image of the not-hidden part of the smaller micro-lenses 212, FIG. 3C, that can be seen through the gaps 230 between larger micro-lenses 216 and 218 arranged on the array of photodiodes 200.

As described above, the solid-state image sensor according to the present invention makes the amount of incident beams, which impinge on the smaller micro-lenses in the oblique direction, substantially equal to that of incident beams coming in the top, bottom, right and left directions with respect to a virtual plane B1, FIG. 3B, formed by the array of photodiodes 100 by closing up the gaps 30 between the larger micro-lenses.

In other words, the maximum incident angle of the imagewise beams that can impinge on the smaller micro-lenses in the top, bottom, right or left directions with respect to the virtual plane B1 formed by the photodiode array is made substantially equal to that of the beams that can impinge on the smaller micro-lenses in the oblique direction. This feature of the invention solves the shading problem.

In this application, the embodiments of the invention are shown with reference to FIGS. 3B and 3C in which the image, projected on a virtual plane perpendicular to the array of photodiodes, of an unhidden part of the smaller micro-lenses that can be seen through the gaps between the larger micro-lenses is made smaller in area than half of the projected image of the entire, smaller micro-lenses or is set to zero. However, if the gaps between the larger micro-lenses are narrower, even slightly, than that of the conventional solid-state image sensor and therefore the projected image of a not-hidden part of the smaller micro-lenses that can be seen through the gaps is reduced in area, the shading reduction is attained even when the above-mentioned area exceeds half of the whole area of the projected image of the smaller micro-lenses.

The entire disclosure of Japanese patent application No. 2004-075578 filed on Mar. 17, 2004, including the specification, claims, accompanying drawings and abstract of the disclosure is incorporated herein by reference in its entirety.

While the present invention has been described with reference to the particular illustrative embodiments, it is not to be restricted by the embodiments. It is to be appreciated that those skilled in the art can change or modify the embodiments without departing from the scope and spirit of the present invention.

What is claimed is:

1. A solid-state image sensor comprising:

an array of photodiodes disposed in a first virtual plane for receiving beams incident from a field of view to be captured; and a plurality of arrangement patterns of micro-lenses provided over said array of photodiodes, each of said plurality of arrangement patterns being composed of a smaller micro-lens and a plurality of larger micro-lenses, each of said plurality of larger micro-lenses being larger in diameter than said smaller micro-lens, said plurality of larger micro-lenses being arranged on top, bottom, right and left sides of said smaller micro-lens with respect to the first virtual plane to form gaps with each other, in each of the arrangement patterns, said smaller micro-lens having an image projected on a second virtual plane, normal to the first virtual plane, such that a not-hidden part of the image which is visible, when viewed in a direction parallel to the first virtual plane, through at least one of the gaps which is formed between ones of said plurality of larger micro-lenses positioned on the top or bottom side and the left or right side of said smaller micro-lens is, at most, half as much in area as the entire image of said smaller micro-lens projected on the second virtual plane.

2. The solid-state image sensor in accordance with claim 1, wherein the area of the not-hidden part is zero.

3. The solid-state image sensor in accordance with claim 2, wherein the area of the not-hidden part is determined by adjusting a curvature of a surface of said plurality of larger micro-lenses.

4. The solid-state image sensor in accordance with claim 3, wherein a maximum incident angle of part of the beams impinging on said smaller micro-lens in top, bottom, right and left directions in the first virtual plane is substantially equal to a maximum incident angle of part of the beams impinging on said smaller micro-lens from an oblique direction in the first virtual plane.

5. The solid-state image sensor in accordance with claim 2, wherein a maximum incident angle of part of the beams impinging on said smaller micro-lens in top, bottom, right and left directions in the first virtual plane is substantially equal to a maximum incident angle of part of the beams impinging on said smaller micro-lens in an oblique direction in the first virtual plane.

6. The solid-state image sensor in accordance with claim 1, wherein the area of the not-hidden part is determined by adjusting a curvature of a surface of said plurality of larger micro-lenses.

7. The solid-state image sensor in accordance with claim 6, wherein a maximum incident angle of part of the beams impinging on said smaller micro-lens in top, bottom, right and left directions in the first virtual plane is substantially equal to a maximum incident angle of part of the beams impinging on said smaller micro-lens from an oblique direction in the first virtual plane.

8. The solid-state image sensor in accordance with claim 1, wherein a maximum incident angle of part of the beams impinging on said smaller micro-lens in top, bottom, right and left directions in the first virtual plane is substantially equal to a maximum incident angle of part of the beams impinging on said smaller micro-lens in an oblique direction in the first virtual plane.

* * * * *